United States Patent
Flynn et al.

(10) Patent No.: US 6,300,234 B1
(45) Date of Patent: Oct. 9, 2001

(54) PROCESS FOR FORMING AN ELECTRICAL DEVICE

(75) Inventors: Todd M. Flynn, Pflugerville; Christopher W. Argento, Cedar Park; Larry J. Larsen, Bastrop, all of TX (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 09/602,099

(22) Filed: Jun. 26, 2000

(51) Int. Cl.$^7$ ................................................. H01L 21/44
(52) U.S. Cl. ............................................ 438/612; 438/106
(58) Field of Search ................................. 438/108, 119, 438/612, 613, 611, 614, 615, 106, 51, 26, 64

(56) References Cited

U.S. PATENT DOCUMENTS

| | | | |
|---|---|---|---|
| 5,492,235 | * 2/1996 | Crafts et al. | 216/13 |
| 5,937,320 | * 8/1999 | Andricacos et al. | 438/614 |
| 6,159,767 | * 12/2000 | Eichelberger | 438/107 |
| 6,162,652 | * 12/2000 | Dass et al. | 438/18 |

OTHER PUBLICATIONS

B.P. Richards et al., "Lead–Free Soldering", Department of Trade and Industry (dti), Report "Analysis of the Current Status of Lead–Free Soldering", 60 pgs.

Motorola C4 Product Design Manual, 1993, vol. I: Chip and Wafer Design, Chapter 1—Technology Overview, Issue A, pp. 1–11 and 8–1–8–2.

E. Jan Vardaman et al., "The Lead–Free Movement: Environmentally Friendly Electronics Manufacturing", TechSearch Int'l. Inc., Technology Licensing & Consulting, pp. 1–79.

\* cited by examiner

Primary Examiner—David Nelms
Assistant Examiner—David Nhu
(74) Attorney, Agent, or Firm—George R. Meyer; Robert A. Rodriguez

(57) ABSTRACT

The present invention includes a process for forming an electrical device. In one embodiment, the process includes applying a solid patternable film over a substrate and forming a conductive material over the substrate while the solid patternable film overlies the substrate, wherein the conductive material extends at least partially within an opening in the patternable film. In another embodiment, the process includes applying a patterned film over a substrate having a pad and exposing the patterned film and the substrate to energy. The patterned film includes a first region that includes a conductor and a second region that does not have a conductor. The energy of the exposure forms an electrical connection between the conductor and the pad. In yet another embodiment, the process includes mechanically applying a film over a semiconductor device substrate, patterning the film to define a first opening to expose a conductive region within the semiconductor device substrate, forming a first conductive layer within the first opening, and forming a second conductive layer over the first conductive layer.

21 Claims, 5 Drawing Sheets

PROCESS FOR FORMING AN ELECTRICAL DEVICE

FIELD OF THE INVENTION

The present invention is generally related to processes for forming electrical devices and more particularly to processes for forming electrical devices where a film or tape is applied to a substrate as part of an operation to form conductors to the substrate.

RELATED ART

In the production of electronic devices, semiconductor wafers typically either go through a wire bond final assembly or a bump final assembly in order to make circuit interconnections. Bump final assembly is an interconnect technology, also known as "flip chip," in which a chip is fabricated with the circuitry facing the packaging substrate and in which the chip is flipped over to match patterned solder bumps on the chip with a corresponding pattern on the packaging substrate. Solder bumps, deposited through a bump mask onto wettable chip pads thus connect to matching wettable packaging substrate pads. The flipped chips must be aligned to corresponding packaging substrate metal patterns, and then electrical and mechanical interconnects are formed simultaneously by reflowing the solder bumps. Bumped wafers currently undergo a mask alignment process in which a shadow mask is manually aligned using stainless steel top and bottom fixtures. This fixture is then maintained through the majority of the process. After mask alignment, a dry etch is performed, which is typically an argon plasma cleaning to remove any heavy oxides on the bond pads and allow for a better attachment of the base metals. Following dry etch, the wafer is subjected to an evaporation high vacuum metal deposition in which the pad limiting metal (PLM) is deposited. For typical CMOS technology, the PLM includes chrome, copper, and gold. Following the PLM deposition, a lead/tin deposition is performed, usually a composite of 97% lead and 3% tin, which forms the solder bump. Following the lead/tin deposition, the fixture is then removed, the mask is taken off and the built-up evaporated materials directly over the top of the bond pads remains. The solder material resembles a truncated cone at this point. The solder is then re-flowed to form the final bump.

The fixture used for the evaporative bump process described above is a molybdenum mask fixture between two stainless steel ring sets with a wafer in between. Disadvantages of the use of this type of mask include the expense of making and maintaining the stainless steel fixtures. After the masks are etched, they may be reused multiple times but tend to get damaged through the manual processing of the wafers. Each mask is expensive, and in a typical production situation, approximately 800 masks per device may be required. In addition, each mask must be sent out to be cleaned after use, typically requiring a large inventory so that half may be cleaned while the other half are being used in processing devices.

Another disadvantage of using this type of shadow mask is the alignment process itself. The alignment process is extremely manual and has a high degree of error. The process consists of cameras, focused on various positioning holes on the mask and coordinating features on the wafer, that an operator manually adjusts in X, Y and Theta positions until the best fit is achieved. The alignment is also difficult because the mask is thermally compensated so that, while the alignment is performed at ambient temperature, the bumps must align with the bond pads at the higher temperature of processing. Therefore, any variation in the initial alignment can cause a further misalignment after thermal expansion of the mask during processing.

Still another limitation of the current mask technology is the size and pitch of solder bumps that can be achieved. Because of the etch process, the thickness of the mask is dependent on the aperture size (the diameter of the bump). For example, a mask for a 100 micron opening is generally about 3.8 mils thick, and as the aperture size decreases, the mask must be thinner, which makes it more susceptible to damage during processing. Yet another limitation is the pitch, or spacing between bumps. For current shadow mask technology, the lower limits are 100 micron bumps on a 225 micron pitch. Smaller pitches may cause an underspray problem because the mask may be more flexible and may deform or lift up from the wafer allowing underspray and causing a short in the device.

BRIEF DESCRIPTION OF THE DRAWINGS

The present invention is illustrated by way of example and not limitation in the accompanying figures, in which like references indicate similar elements, and in which.

Skilled artisans appreciate that elements in the figures are illustrated for simplicity and clarity and have not necessarily been drawn to scale. For example, the dimensions of some of the elements in the figures may be exaggerated relative to other elements to help improve the understanding of the embodiments of the present invention.

DETAILED DESCRIPTION

The present invention includes a process for forming an electrical device. In one embodiment, the process includes applying a solid patternable film over a substrate and forming a conductive material over the substrate while the solid patternable film overlies the substrate, wherein the conductive material extends at least partially within an opening in the patternable film. In another embodiment, the process includes applying a patterned film over a substrate having a pad and exposing the patterned film and the substrate to energy. The patterned film includes a first region that includes a conductor and a second region that does not have a conductor. The energy of the exposure forms an electrical connection between the conductor and the pad. In yet another embodiment, the process includes mechanically applying a film over a semiconductor device substrate, patterning the film to define a first opening to expose a conductive region within the semiconductor device substrate, forming a first conductive layer within the first opening, and forming a second conductive layer over the first conductive layer. The present invention is defined by the claims and is better understood after reading the description of the embodiments that follow.

Figure 1:
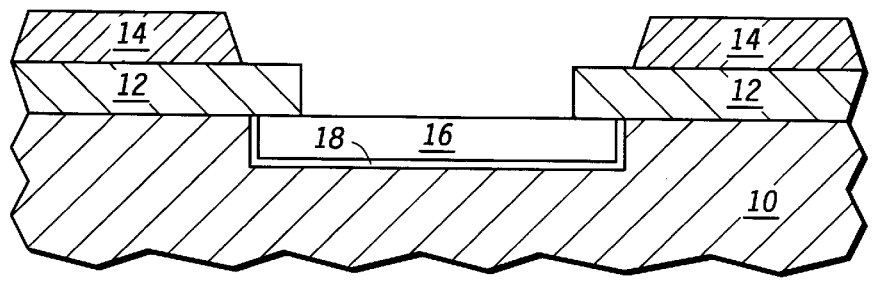
FIG. 1 includes an illustration of a cross-sectional view of a portion of a semiconductor device substrate that is prepared for masking and deposition of a solder bump.

Turning to the drawings, FIG. 1 illustrates a portion of an electrical device that utilizes a bump interconnect. This device includes a substrate 10, that may be any electrical or semiconductor substrate known in the art, such as a silicon substrate, gallium arsenide base, a silicon carbide base material, a printed circuit board, an individual package substrate, a ceramic package, or a plastic or resin package. Prior to deposition of a conductive layer, the device may be subject to various pretreatments known in the art, including exposing the substrate to a plasma gas including a noble gas or an oxygen-containing gas, exposing the substrate to a reducing solution, or forming a metal-containing layer over the substrate in those cases in which the substrate may include an oxide film, and in which the metal layer reduces the oxide film.

Layered on the substrate 10 is a passivation layer 12, which typically consists of a nitride passivation, a plasma enhanced nitride or an SiON (silicon on nitride) layer. Also shown in the device in FIG. 1 is a polyimide layer 14. Polyimide is typically used as a stress buffer to protect the wafer from any of various types of mechanical damage, and it also reduces alpha particle emissions when used in sensitive memory devices. Additionally, for certain types of processing, in particular the bump interconnect known in the art as controlled collapse chip connect (C4), the polyimide allows for adhesion of chrome pad limiting metals without a barrier film.

A bond pad, which includes adhesion/barrier film 18 and a final metal 16, is exposed within the opening that extends through the passivation layer 12 and polyimide layer 14. The bond pad includes the combination of the film 18 and final metal 16 at the point of contact for further interconnect processing. The final metal 16 may be a conductive material including lead, tin, gold, copper, bismuth, silver, antimony, aluminum, or combinations thereof, for example, and in certain embodiments, a lead free material is used. Shown beneath the bond pad, is an adhesion/barrier film 18 typically includes a layer of refractory metal nitride, and may be a layer of titanium, tungsten or tantalum nitride, and may also be chrome, copper, gold, titanium, tungsten, tantalum, molybdenum or combinations thereof, chosen for its compatibility with the final metal 16.

Figure 2:
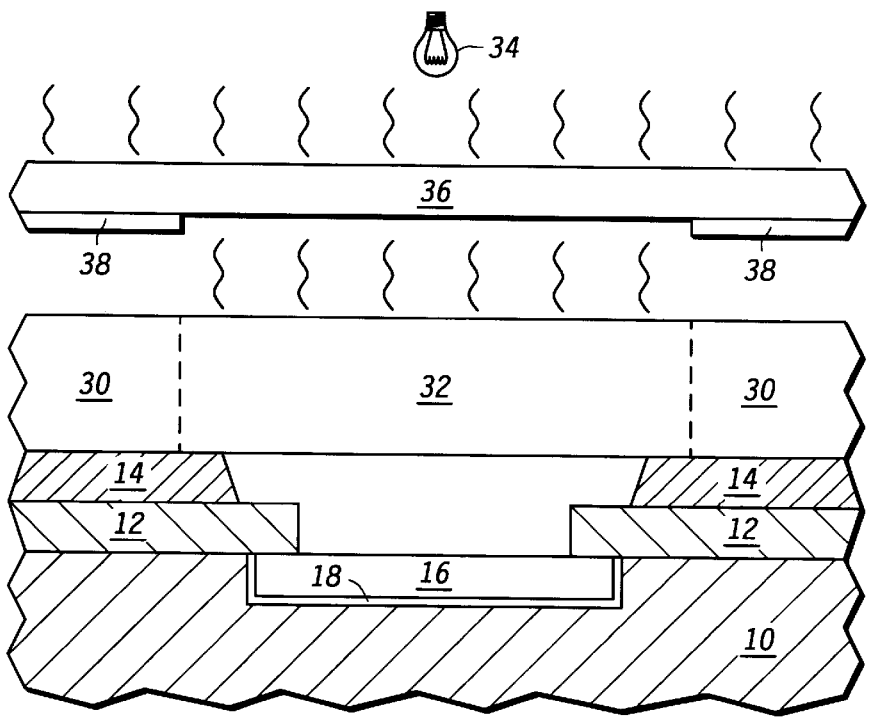
FIG. 2 includes an illustration of a cross-sectional view of a portion of a semiconductor device substrate in which a masking tape has been applied, and in which radiation is impinging on the substrate through a photomask.

FIG. 2 illustrates the device after a film material or tape 30 has been applied. In the embodiment shown in FIG. 2, the tape was not pre-patterned prior to application to the device. In certain embodiments, the film may have a predefined pattern contained therein which determines the etching pattern on the electrical device. Alternatively, the pattern may formed in the tape after it is placed on the device. In the embodiment shown in FIG. 2, the film has not been pre-defined or pre-etched and is mechanically applied directly to the device. As shown, a radiation source 34 including an incandescent or laser light source, a mercury arc vapor lamp, or the like is used to pattern the tape. A reticle or photo mask is placed between the radiation source and the bond pad. The lithographic mask includes a light transparent or radiation transparent layer typically made of a quartz material 36 and is patterned with an opaque or attenuating layer 38 which may be chromium, another radiation opaque material, a radiation scattering material, or the like. Radiation that impinges on the film 30 creates a pattern that corresponds to the pattern of the lithographic mask by causing the region 32 as shown to become chemically altered, either by the breaking of chemical bonds or by crosslinking reactions in a negative process in order to make the pattern region available for selective removal or retention in a subsequent step.

Figure 3:
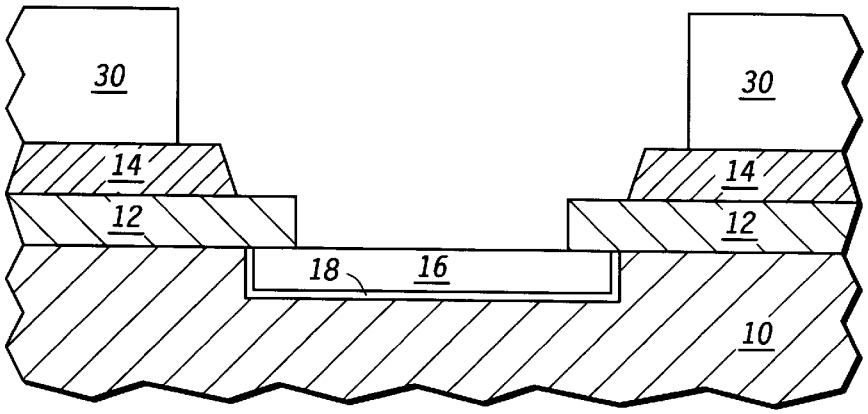
FIG. 3 includes an illustration of a cross-sectional view of a portion of a semiconductor device substrate after patterning.

FIG. 3 shows the substrate after irradiation and removal of the region 32 of the patterned tape. As seen in the figure, the tape 30 remains in the area surrounding the opening which allows for deposition of a conductive material through the opening to contact the bond pad. After removal of the exposed region 32 of the film as shown in FIG. 3, the bond pad may then be subjected to another pre-treatment, which may include exposing the substrate to a plasma gas including a noble gas or an oxygen-containing gas, exposing the substrate to a reducing solution, or forming a metal-containing layer over the substrate. The substrate may include an oxide film and the metal-containing layer would be capable of reducing the oxide film. Pre-treatment may include a dry etch, such as an argon plasma, or a wet acid etch, such as methylsulfonic acid (MSA) to reduce the native oxides on the bond pad layer. In other embodiments, a conductive metal oxide may be deposited on the bond layer, such as oxides of rhenium.

Figure 4:
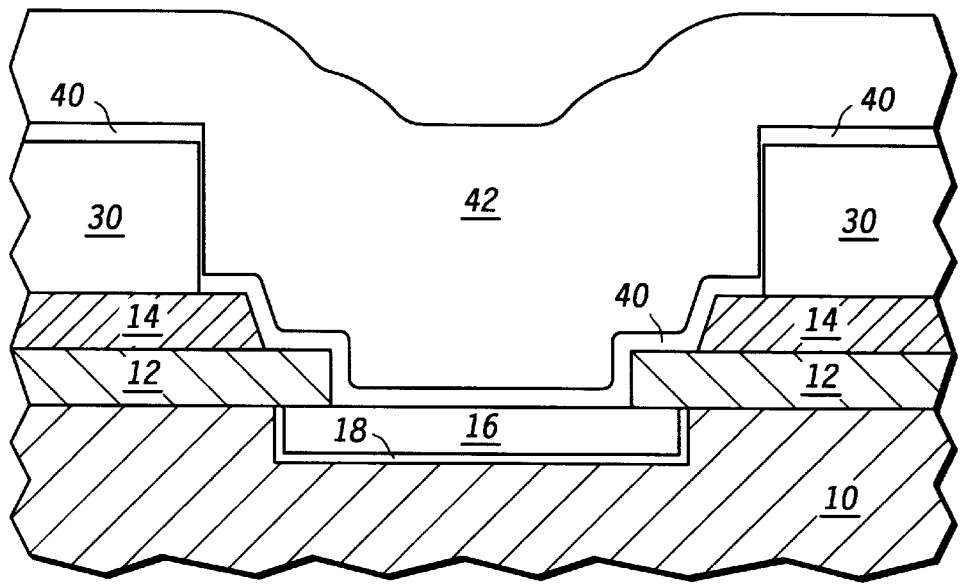
FIG. 4 includes an illustration of a cross-sectional view of a portion of a semiconductor device substrate after deposit of a pad limiting metal and bump material.

In the subsequent processing steps shown in FIG. 4, a PLM or pad-limiting metal 40 may be deposited on the substrate as shown. Because the deposition is directional, the layer is thinner along the sidewalls of the tape compared to the top surface of the tape. The PLM may also be referred to as an UBM or under-bump metallurgy. In some embodiments, the PLM is a chromium copper gold alloy, however other materials may be used including, in certain embodiments, refractory metals and nitrides including titanium/titanium tungsten, tantalum, or tantalum nitride. The PLM material is selected to be compatible with the bump material to be placed on top of the pad as well as the base pad material itself. For example, titanium would be more compatible with aluminum conductivity layers, and a tantalum layer would be more compatible with a copper conductive layer. The main interconnect 42 or solder layer which forms the bump over the pad, is deposited onto the PLM layer. The interconnect 42 is typically a lead tin material of various concentrations, such as a 97% lead/3% tin composition, a eutectic solder material of 63% tin/37% lead, or the like. Other materials that may be used include, but are not limited to gold, copper, bismuth, silver, antimony, or any combination of those. Skilled artisan may find some combinations better than others, and those combinations could include a tin/antimony a bismuth/silver, or possibly a tin/copper material, especially in situations in which a lead-free material is desired.

Figure 5:
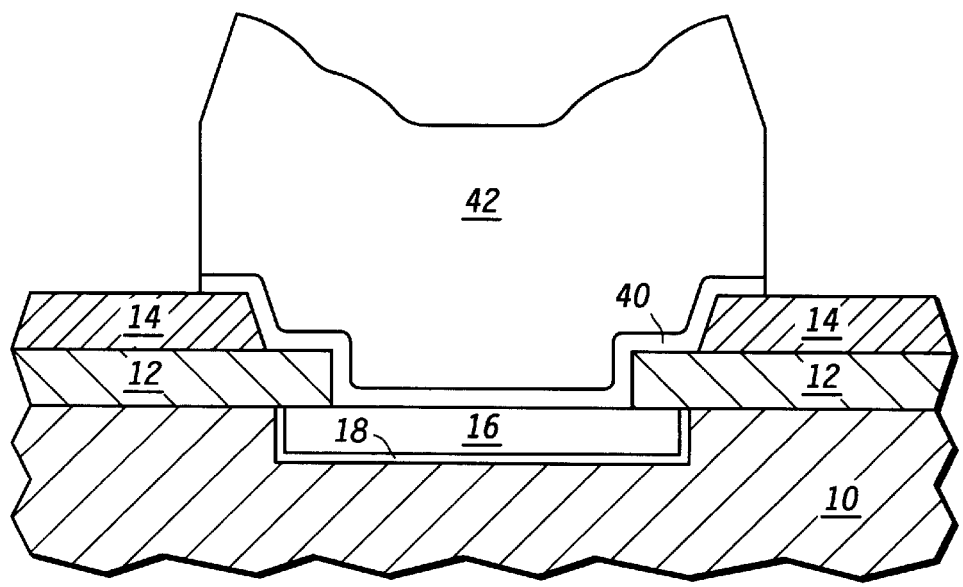
FIG. 5 includes an illustration of a cross-sectional view of a portion of a semiconductor device substrate after removal of the tape mask.

After deposition of the interconnect metal 42, the tape 30 (as seen in FIG. 4) is removed from the substrate as shown as FIG. 5. In certain alternative embodiments, the tape 30 may be left in place to serve as a protective layer, stress buffer, or even as an alpha particle shield. Typically, the tape 30 is mechanically removed, for example by laying over a second layer of tape (not shown) that adheres to the tape layer 30. When the second layer of tape is mechanically removed, the tape 30 is also removed because of the adhesion between the two layers of tape. The tape 30 may also be removed by chemical dissolution or by chemically dissolving an adhesive layer that may be on the bottom surface of the tape 30. In certain embodiments, the tape 30 is thermally bonded to the underlying substrate, and in those situations, the application of heat may facilitate removal of the tape or film layer. After removal of the tape, the device may be subject to a post-treatment clean or processing step, which may include a dry oxygen ash treatment or a solvent treatment with any solvent known in the art such as water, an organic solvent, an alcohol, ketone, ether, alkyl solutions, acidic acid, acetates, carboxylic acid containing solvents, or the salt of carboxylic acid containing solvents. In certain embodiments, the substrate will be subjected to a wet acid etch such an etch with a weak HF solution or other inorganic acids.

Figure 6:
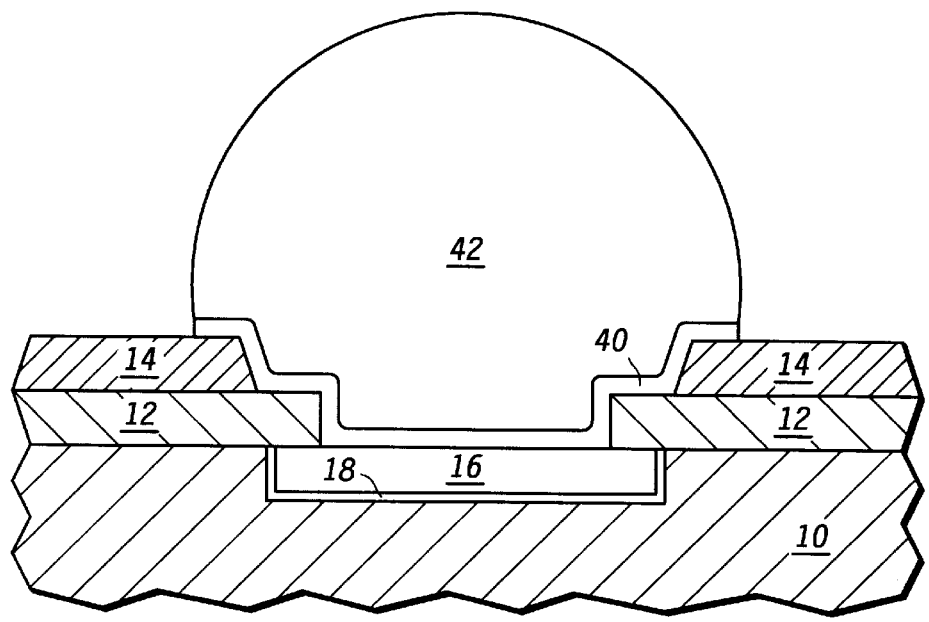
FIG. 6 includes an illustration of a cross-sectional view of a portion of a semiconductor device substrate after reflowing of the bump material.

Referring to FIG. 5, the final metal 42 may include various materials known in the art, and for the C4 process is typically lead and tin. The majority of the lead is evaporated first and is the dominant material which comprises 97% of the final bump and then the final 3% of tin is deposited on the top. The solder materials may be applied by any means known in the art, including evaporation, physical vapor deposition, sputtering, plating, or even stencil printing. In an embodiment known as the E-3 process, a larger percentage tin is deposited on the top of the stack and the solder bump is not reflowed before attaching the die to the packaging substrate. In this process, the extra tin at the top of the bump forms a eutectic solder only near the tip allowing good solderability to the leaded package carrier or substrate while still keeping the majority of the lead interface intact to allow for increased reliability of the package. In a typical C4 process, a reflow act is performed to form a reflowed bump 42 as shown in FIG. 6. Heat during the reflow act causes the evaporated materials to form a ball-up or a bump formation that serves as a final interconnect to the die.

An alternative embodiment is shown in FIGS. 7–13 and demonstrates a method of use in which a typical perimeter array substrate used in a wire bond pattern is converted into a bump or flip-chip pattern. As used herein, a perimeter array substrate is a substrate (e.g., a die) that has its original bond pads, such as those used for wire bonding, locates near the edge of the substrate. Effective, a set of conductors are used to re-route the conduction paths from the bumps to the original "wire bond" bond pads 102 to allow more space between subsequently formed bumps. The increased spacing typically increases processing margins and yields.

Figure 7:
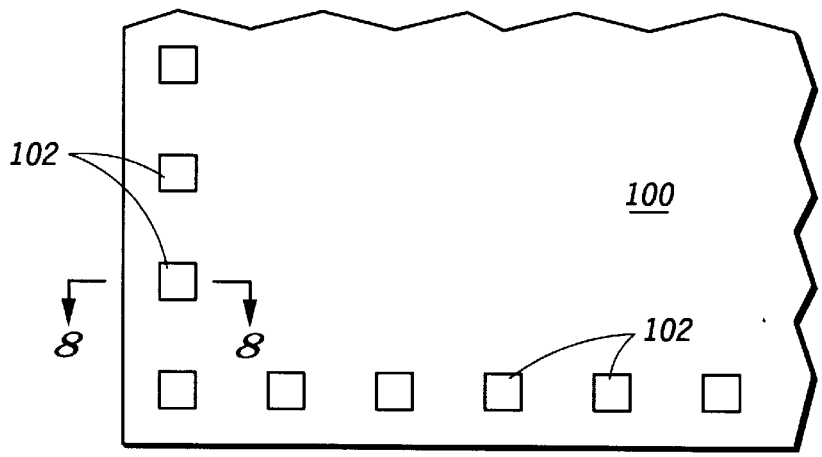
FIG. 7 includes an illustration in top view of a portion of a perimeter array substrate.
Figure 8:
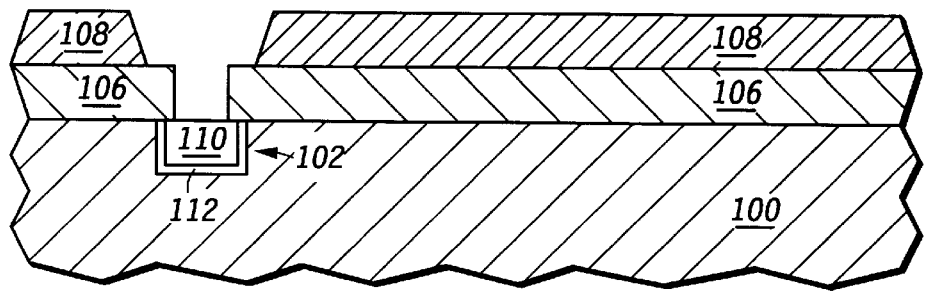
FIG. 8 includes an illustration of a cross-sectional view of the substrate along sectioning lines 8—8 of FIG. 7.

By use of the methods disclosed herein, an array may be configured in which bumps have an aperture as narrow as 90 microns, and with a pitch of about 190 microns. FIG. 7 illustrates a substrate 100 upon which is a typical perimeter array of bond pads 102. FIG. 8 shows a cross section of the substrate 100 at sectioning lines 8—8 in FIG. 7. The substrate may be any semiconductor material known in the art, including a silicon dioxide, a silicon nitride, gallium arsenate, or a silicon carbide, for example. Bond pad 102 includes an adhesion/barrier film 112 and a conductive fill material 110. These materials can be any of those previously recited regarding adhesion/barrier film 18 and final metal 16, respectively, in a previous embodiment. On the substrate is a passivation layer 106, and on top of the passivation layer 106 is a polyimide layer 108. The polyimide layer 108 is optional but is often used in memory devices for cushioning and alpha radiation barrier.

Figure 9:
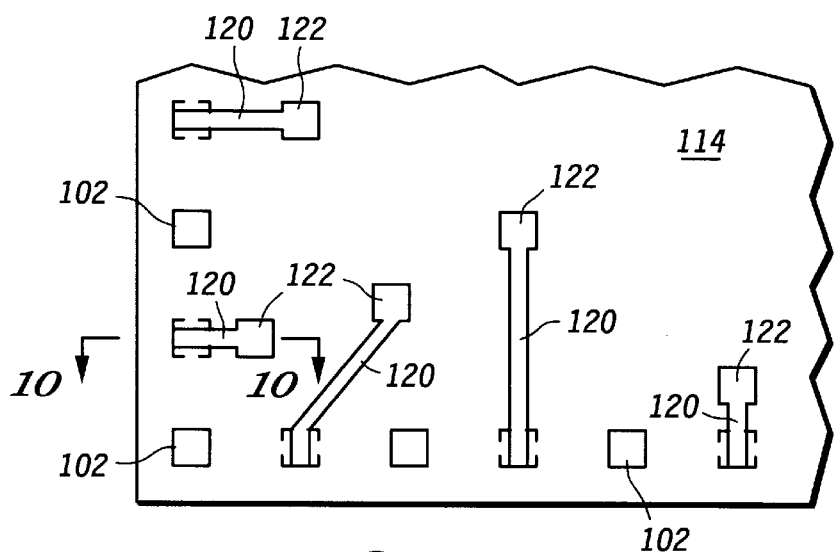
FIG. 9 includes an illustration in top view of the substrate of FIG. 8 after application of a patterned tape or film.
Figure 10:
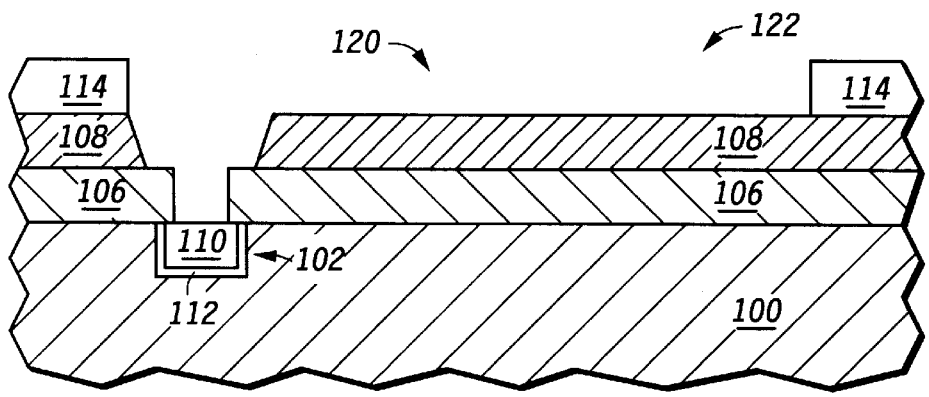
FIG. 10 includes an illustration of a cross-sectional view of the substrate of FIG. 9 after application of a patterned tape or film.

FIG. 9 demonstrates the device of FIG. 7 after a patternable tape or film had been mechanically applied to the surface of the substrate and a pattern has been photo-etched into the film or tape. The tape method previously described is used to form the conductors needed for re-routing. The tape 114 contains openings over the existing bond pads 102 that includes locations where traces 120 and "bump" pads 122 are subsequently formed. The bump pads 122 are a type of bond pad. The term "bump pad" is used to reduce the confusion between pad 122 and pad 102. FIG. 10 includes a cross-section of an opening formed in the tape 114 to re-route one of the bond pads 102 to a bump pad 122.

Figure 11:
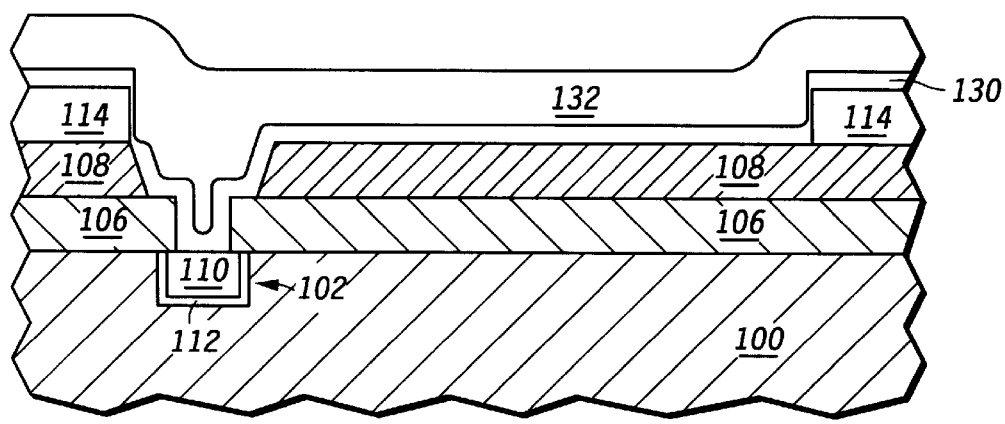
FIG. 11 includes an illustration of a cross-sectional view of the substrate of FIG. 10 after deposition of conductive metal layers.

As shown in FIG. 11, subsequent to the patterning step, an adhesion/barrier film 130 and a conductive layer 132 are deposited within the opening in the tape 114 and over the substrate 100. The adhesion/barrier film 130 and conductive layer 132 may be any of those materials previously listed with respect to the adhesion/barrier film 18 and final metal 16 in a previous embodiment. In some embodiments forming bumps or wire bonding to copper may be an issue. In these embodiments, copper interconnects may be used with the conductive layer 132 being mostly aluminum to allow better external connections (e.g., wire bonds, etc.). After portions of the film 130 and layer 132 lying outside the opening are removed, the tape 114 is removed using a method previously described.

Figure 12:
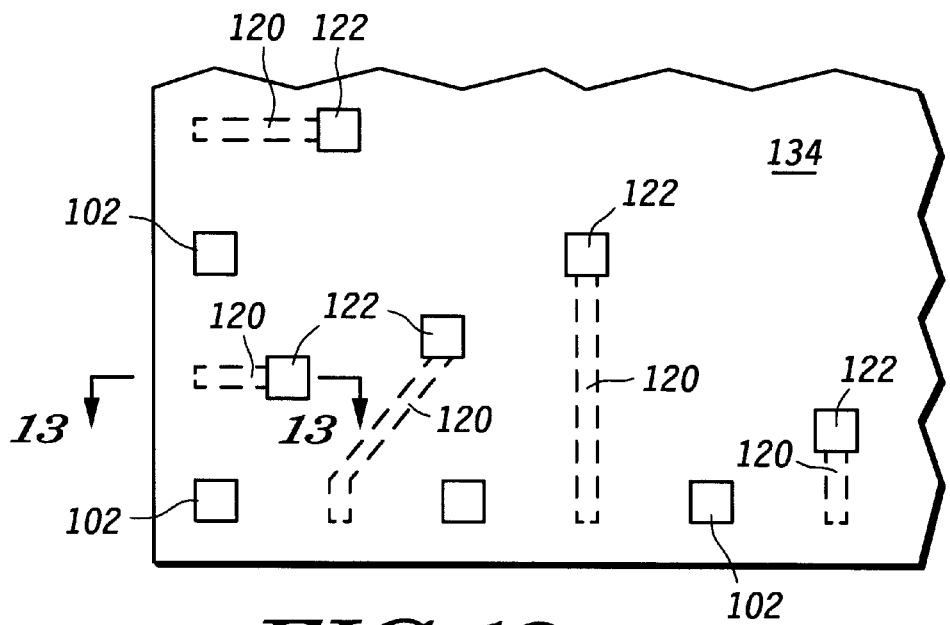
FIG. 12 includes an illustration in top view of the substrate of FIG. 11 configured to contain new bond pad sites.
Figure 13:
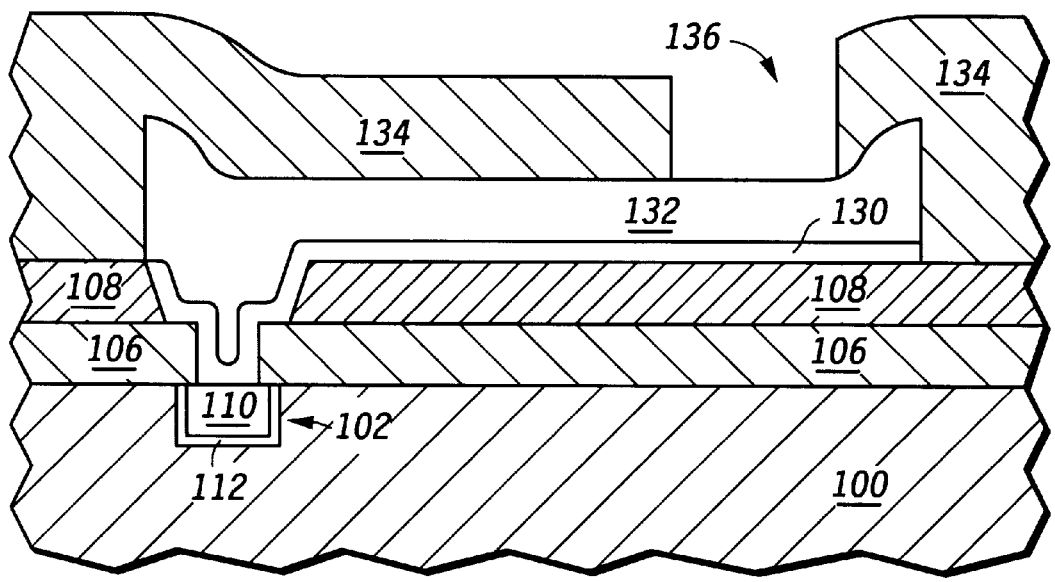
FIG. 13 includes an illustration of a cross-sectional view of the substrate of FIG. 12 containing an opening for a bump.

A dielectric layer 134, such as a polyimide layer, is deposited and patterned to form openings 136 that expose the bump pads 122 as shown in FIGS. 12 and 13. The traces 120 are illustrated by dashed lines because the traces are covered by the dielectric layer 134. The substrate as shown in FIG. 13 is then ready for the application of the bump material as previously described or for wire bonding.

Alternatively, applications for the taping processes described could be applied to virtually any resist process currently being used, such as in the circuit board industry or any other electronics, packaging, or semiconductor industry. Patterning resist is currently used in the defining of the polyimide pattern prior to etch for non photo resist of polyimides and the tape process could also be applied as an alternative for that. The tape could also be used in a stencil printing squeegee process in which thick resist is typically used. In this process, solder pastes are stenciled or squeegeed into the openings followed by reflow and resist etching. The tape described herein could be used in a similar fashion if it were peeled off prior to reflow.

In the foregoing specification, the invention has been described with reference to specific embodiments. However, one of ordinary skill in the art appreciates that various modifications and changes can be made without departing from the scope of the present invention as set forth in the claims below. Accordingly, the specification and figures are to be regarded in an illustrative rather than a restrictive sense, and all such modifications are intended to be included within the scope of present invention.

Benefits, other advantages, and solutions to problems have been described above with regard to specific embodiments. However, the benefits, advantages, solutions to problems, and any element(s) that may cause any benefit, advantage, or solution to occur or become more pronounced are not to be construed as a critical, required, or essential feature or element of any or all the claims. As used herein, the terms "comprises," "comprising," or any other variation thereof, are intended to cover a non-exclusive inclusion, such that a process, method, article, or apparatus that comprises a list of elements does not include only those elements but may include other elements not expressly listed or inherent to such process, method, article, or apparatus.

What is claimed is:

1. A process for forming an electrical device comprising:

applying a solid patternable film over a substrate wherein the solid patternable film is further characterized as a tape film; and forming a first conductive material over the substrate while the solid patternable film overlies the substrate, wherein the first conductive material extends at least partially within an opening in the solid patternable film.

2. The process of claim 1, wherein applying the solid patternable film is performed by an act selected from a group consisting of:

mechanically applying the solid patternable film to the substrate;

thermally fusing the solid patternable film to the substrate; and electrostatically attaching the solid patternable film to the substrate.

3. The process of claim 1, further comprising treating the substrate before forming the first conductive material, wherein treating is selected from a group consisting of:

exposing the substrate to a plasma gas including a noble gas or an oxygen-containing gas;

exposing the substrate to a reducing solution; and forming a metal-containing layer over the substrate, wherein the substrate includes an oxide film and the metal-containing layer is capable of reducing the oxide film.

4. The process of claim 1, wherein the first conductive material is substantially free of lead.

5. The process of claim 1, further comprising forming a second conductive material before forming the first conductive material.

6. The process of claim 5, wherein the second conductive material includes a refractory metal nitride.

7. A process for forming an electrical device comprising:

applying a patterned tape film over a substrate having a bond pad, forming a conductive region within a patterned area defined by patterned tape film, wherein the conductive region includes traces and a conductive bump pad portion, wherein the traces reroute a conduction path from the bond pad to the conductive bump pad portion; and exposing the patterned tape film and the substrate to energy to form an electrical connection between the conductive region and the pad.

8. The process of claim 7, wherein exposing the patterned film and the substrate to energy comprises heating the patterned film and substrate to flow the conductor.

9. A process for forming an electrical device comprising:

mechanically applying a film over a semiconductor device substrate, wherein the film is further characterized as a tape material;

patterning the film to define a first opening to expose a conductive region within the semiconductor device substrate;

forming a first conductive layer within the first opening; and forming a second conductive layer over the first conductive layer.

10. The process of claim 9, wherein the film has a thickness of at least approximately 40 microns.

11. The process of claim 9, wherein the film has a pattern of openings including the first opening, wherein the pattern is characterised by a pitch of no greater than approximately 190 microns.

12. The process of claim 9, wherein the film includes a material selected from a group consisting of polyimide, polyethylene, polypropylene, and mylar.

13. The process of claim 9, wherein the film is radiation imageable.

14. The process of claim 9, further wherein a temperature of the semiconductor device substrate is at least approximately 35 degrees Celsius during mechanically applying.

15. The process of claim 9, further comprising removing the film from the semiconductor device substrate after forming the second conductive layer.

16. The process of claim 15, wherein the removing is performed by peeling the film from the semiconductor device substrate after forming the second conductive layer.

17. The process of claim 15, wherein the removing is performed by a chemical reaction with the film.

18. The process of claim 15, further comprising cleaning the semiconductor device substrate after removing the film.

19. The process of claim 18, wherein the cleaning comprises an act selected from a group consisting of:

exposing the semiconductor device substrate to water;

exposing the semiconductor device substrate to an organic solvent; and exposing the semiconductor device substrate to a plasma gas including an oxygen-containing gas.

20. The process of claim 9, wherein the electrical device is substantially free of lead.

21. A process for forming an electrical device comprising:

mechanically applying a film over a semiconductor device substrate, patterning the film to define a first opening to expose a conductive region within the semiconductor device substrate;

forming a first conductive layer within the first opening;

forming a second conductive layer over the first conductive layer; and removing the film from the semiconductor device substrate after forming the second conductive layer, wherein the removing is performed by peeling the film from the semiconductor device substrate after forming the second conductive layer.

* * * * *